United States Patent
Ji et al.

(10) Patent No.: US 11,578,843 B2
(45) Date of Patent: Feb. 14, 2023

(54) LED FLEXIBLE STRIP LAMP AND MANUFACTURING METHOD THEREOF

(71) Applicants: Self Electronics Co., Ltd., Zhejiang (CN); Wanjiong Lin, Zhejiang (CN); Self Electronics USA Corporation, Norcross, GA (US)

(72) Inventors: Feng Ji, Zhejiang (CN); Zhaoyong Zheng, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days.

(21) Appl. No.: 17/304,288

(22) Filed: Jun. 17, 2021

(65) Prior Publication Data
US 2021/0396364 A1    Dec. 23, 2021

(30) Foreign Application Priority Data

Jun. 19, 2020 (CN) .......................... 202010565585.7

(51) Int. Cl.
| | |
|---|---|
| *F21S 4/24* | (2016.01) |
| *F21V 23/06* | (2006.01) |
| *H05K 1/11* | (2006.01) |
| *F21Y 115/10* | (2016.01) |

(52) U.S. Cl.
CPC ................ F21S 4/24 (2016.01); F21V 23/06 (2013.01); H05K 1/117 (2013.01); H05K 1/118 (2013.01); *F21Y 2115/10* (2016.08); *H05K 2201/10106* (2013.01)

(58) Field of Classification Search
CPC ........ F21S 4/24; F21S 4/00; F21S 4/20; F21S 4/22; F21S 2/00; F21S 2/005; F21V 23/06; F21V 15/015; F21V 21/005; H05K 1/117–118; H05K 1/189; H05K 2201/10106; F21Y 2115/10; F21Y 2103/10
See application file for complete search history.

(56) References Cited

U.S. PATENT DOCUMENTS

| | | | |
|---|---|---|---|
| 2015/0241035 A1* | 8/2015 | Dankelmann | F21V 21/005 439/725 |
| 2020/0053875 A1* | 2/2020 | Holec | H01R 13/717 |

* cited by examiner

*Primary Examiner* — Anne M Hines
*Assistant Examiner* — Jose M Diaz
(74) *Attorney, Agent, or Firm* — Wang Law Firm, Inc.

(57) ABSTRACT

An LED flexible strip lamp has a strip lamp holder, a conductive flexible strip, an LED flexible strip and a lamp cap, the LED flexible strip includes a first bonding pad disposed at its end, the conductive flexible strip includes a flexible insulating sheet, a conductive metal foil, a second bonding pad; the lamp cap includes an internal connector, and the internal connector includes an elastic conductive member abutting against the conductive metal foil. a conductive member with the bonding pad is arranged to be welded to the LED flexible strip so as to be matched with the lamp holder in an inserted mode, automation can be achieved conveniently, and the problem that an original LED flexible strip lamp is low in production efficiency due to the fact that the lamp holder needs to be installed manually is solved.

11 Claims, 9 Drawing Sheets

```
┌─────────────────────────────────────┐
│ Connect the LED flexible strip 200  │
│ and the conductive flexible strip   │ ─── 001
│ 400 by overlapping the second       │
│ bonding pad 403 and the first       │
│ bonding pad 201;                    │
└─────────────────────────────────────┘
                   │
                   ▼
┌─────────────────────────────────────┐
│ Mount the LED flexible strip 200    │
│ and conductive flexible strip 400   │ ─── 002
│ on the mounting surface of the      │
│ strip lamp holder 100;              │
└─────────────────────────────────────┘
                   │
                   ▼
┌─────────────────────────────────────┐
│ Mount the lamp cap 300 to one end   │
│ of the strip lamp holder 100        │
│ provided with a conductive flexible │ ─── 003
│ strip 400, and after assembly in    │
│ place, the elastic conductive       │
│ member 3031 of the lamp cap 300     │
│ abuts the conductive metal foil 402.│
└─────────────────────────────────────┘
```

FIG. 9

LED FLEXIBLE STRIP LAMP AND MANUFACTURING METHOD THEREOF

RELATED APPLICATION

This application claims priority to a Chinese Patent Application No. CN 202010565585.7, filed on Jun. 19, 2020.

FIELD OF THE TECHNOLOGY

The invention relates to the technical field of lighting equipment manufacturing, in particular to an LED flexible strip lamp and a manufacturing method thereof.

BACKGROUND OF THE INVENTION

In the context of energy saving and environmental protection, LED lamps are increasingly used in the home and commercial lighting fields because of their high light-emitting efficiency and good light-gathering performance.

LED lamps can be roughly divided into down lamps and strip lamps from the appearance. Among them, the strip lamps have the advantage of a wide lighting range and are suitable for various commercial lighting. The strip lamp includes a strip lamp holder, a light strip with LED chips, and an end cover. Generally, the end cover is provided with an external connector for power supply. In many cases, commercial lighting strip lamps require different lengths of lighting in the same project or scene because of their different application positions. At this time, it is very convenient to use flexible strips as light strips and can be tailored or connect according to different lengths. The flexible strip is specifically a flexible LED light strip, which uses FPC to assemble circuit boards and uses SMD LEDs to assemble, so that the thickness of the product is only the thickness of a coin or thinner than that, which basically does not take up space. The general specification is 30 cm in length which contains 18 pieces LEDs, 24 LEDs, and 50 cm in length which contains 15 LEDs, 24 LEDs, 30 LEDs, etc., and it can be adjusted according to needs, and different users have different specifications. And it can be cut at will, and it can be extended at will without affecting the light emission. The FPC material is soft, can be bent, folded, and wound arbitrarily, and can be moved and stretched in three-dimensional space without breaking.

At present, when the flexible strip is used as a light strip to manufacture LED lamps, the electrical connection between the connector in the end cap and the light strip generally requires manual welding. If automatic installation is required, the bonding pad at the end of the flexible strip needs to be connected to the connector. Since the connector has certain rigidity, such as inserts and pins, which cannot be directly welded to the pads of the flexible strip, the flexible strip needs to be modified, which makes the structure complicated.

BRIEF SUMMARY OF THE INVENTION

In view of this, the present invention provides an LED flexible strip lamp and a manufacturing method thereof to solve the above technical problems.

An LED flexible strip lamp, comprising a strip lamp holder, an LED flexible strip arranged on the strip lamp holder and extending along its length, and a lamp cap arranged on one end of the strip lamp holder, the LED flexible strip includes a first bonding pad disposed at its end, characterized in that, it also includes a conductive flexible strip connected to the LED flexible strip, the conductive flexible strip includes:

a flexible insulating sheet, arranged on the strip lamp holder;

a conductive metal foil, arranged on the flexible insulating sheet and extending from reverse direction of the LED flexible strip;

a second bonding pad, arranged on the flexible insulating sheet and located on the side of the conductive metal foil close to the LED flexible strip and electrically connected to the conductive metal foil, the second bonding pad and the first bonding pad are connected by welding;

a cover layer, which covers the top surface and avoids the working area of the conductive metal foil and the second bonding pad;

the lamp cap includes:

an end cover, connected to the end of the strip lamp holder;

an external connector, arranged on the outer side of the end cover;

an internal connector, arranged on the inner side of the end cover, and the internal connector includes an elastic conductive member abutting against the conductive metal foil.

advantageously, there are at least two first bonding pads, which are spaced apart along the width direction of the conductive flexible strip, so the conductive metal foil and the second bonding pads are provided with the same number of groups as the first bonding pads and are spaced apart along the width direction; the second bonding pads and the first bonding pads are respectively connected by welding in one-to-one correspondence, and the elastic conductive members are provided with the same amount as the conductive metal foils and distributed along the width direction at intervals, and the elastic conductive members and the conductive metal foils respectively abut in a one-to-one correspondence.

advantageously, the elastic conductive member is a strip-shaped conductive strip, which comprises:

a connecting section, one end of the connecting section is fixed, and the other end first extends along the length direction of the strip lamp holder;

an abutting section, one end of the abutting section is connected with the connecting section, and the other end is inclined and extended backward and turned upward.

advantageously, the connecting section is dangling in a direction perpendicular to the flexible insulating sheet.

advantageously, the strip lamp holder is provided with a lamp cavity extending along its length direction, a light outlet is provided on one side of the lamp cavity, and the end cover includes an insert block inserting from the end surface of the strip lamp holder into the lamp cavity along the length direction, and the elastic conductive member is arranged on the side of the insert block facing the lamp cavity.

advantageously, the first bonding pad is a solder tab or a solder hole.

advantageously, the second bonding pad is a solder tab or a solder hole.

advantageously, the conductive metal foil is copper foil.

advantageously, the conductive metal foil is a long strip with its length along the length direction of the strip lamp holder.

advantageously, the length of the conductive metal foil is 10 mm-30 mm.

A method for manufacturing an LED flexible strip lamp, using the above mentioned LED flexible strip lamp, wherein it comprises the following steps:

001. Connect the LED flexible strip and the conductive flexible strip by overlapping the second bonding pad and the first bonding pad;

002. Mount the LED flexible strip and conductive flexible strip on the mounting surface of the strip lamp holder;

003. Mount the lamp cap to one end of the strip lamp holder provided with a conductive flexible strip, and after assembly in place, the elastic conductive member of the lamp cap abuts the conductive metal foil.

advantageously, the mounting of the lamp cap to the strip lamp holder is realized by plugging, and the plugging direction is along the length direction of the strip lamp holder.

Technical effects of the present invention:

The LED flexible strip lamp of the present invention is welded with the LED flexible strip by setting a conductive sheet with a bonding pad to realize the plug-in cooperation with the lamp cap, which is convenient to realize automation, and overcomes the need for manual installation of the original LED soft strip lamp and solve the problem of inefficiency.

BRIEF DESCRIPTION OF THE DRAWINGS

The embodiments of the present invention are described below in conjunction with the drawings, in which:

FIG. 9 is a flow diagram of the manufacturing method of the LED flexible strip lamp of the first embodiment.

DETAILED DESCRIPTION OF THE INVENTION

Figure 1:
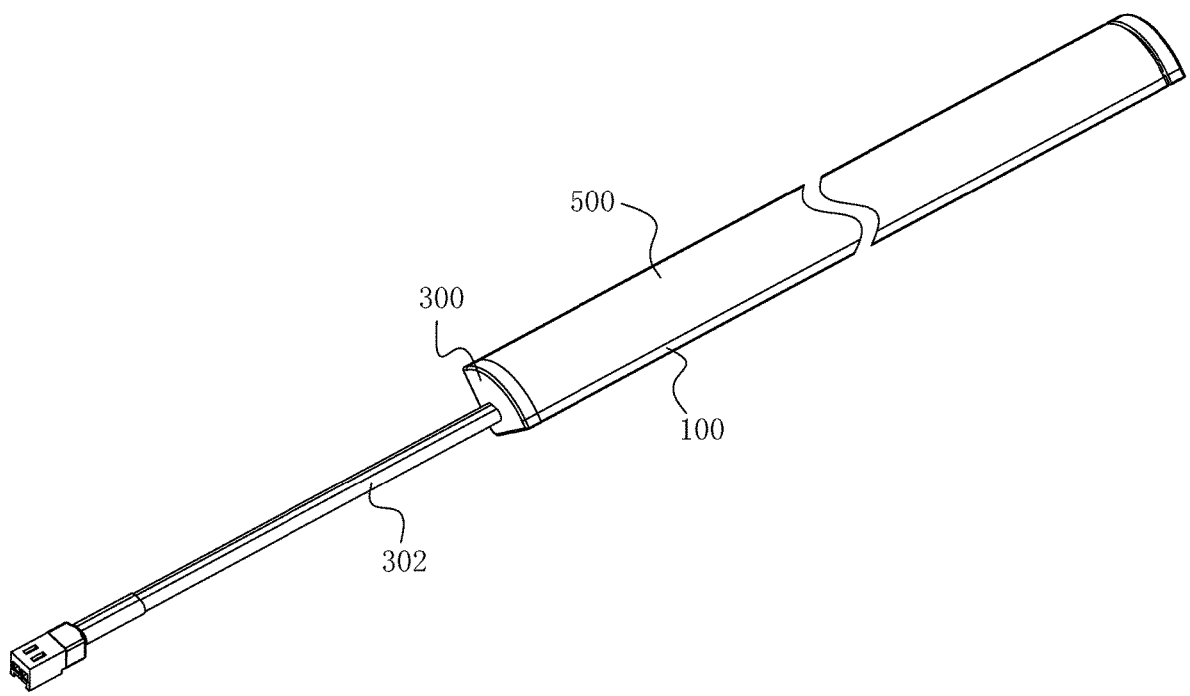
FIG. 1 is a schematic diagram of the structure of the LED flexible strip lamp of the first embodiment.
Figure 2:
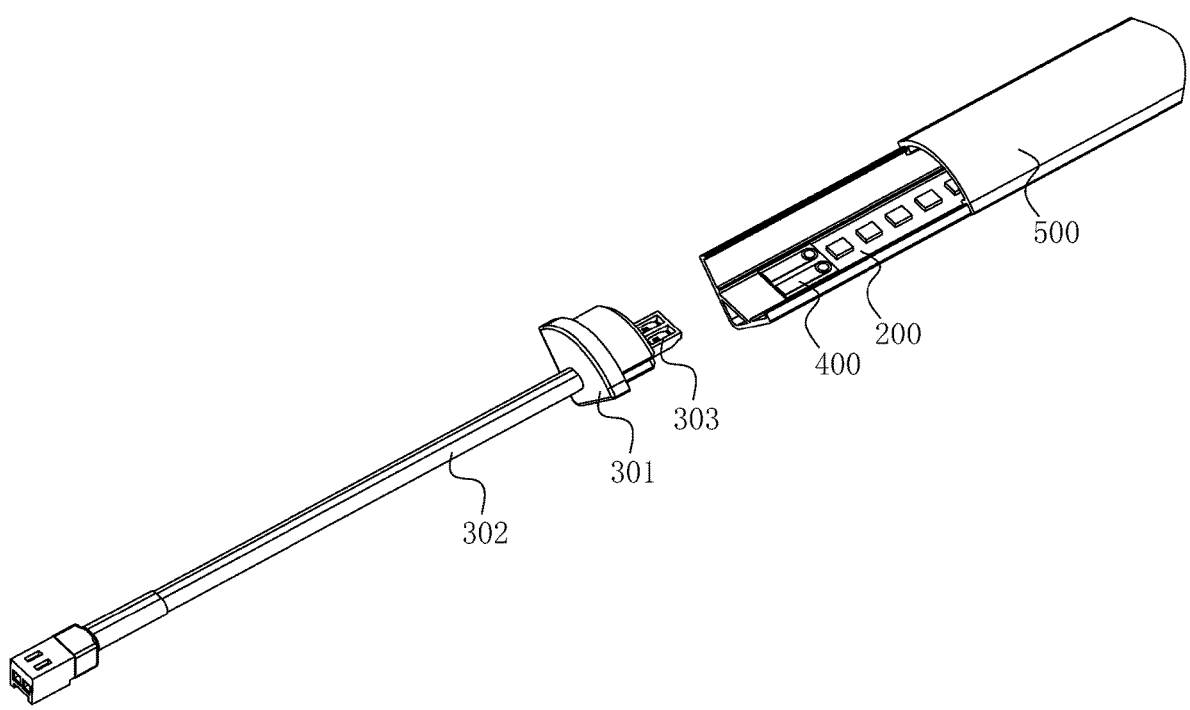
FIG. 2 is a schematic diagram of the internal structure of the LED flexible strip lamp of the first embodiment.
Figure 3:
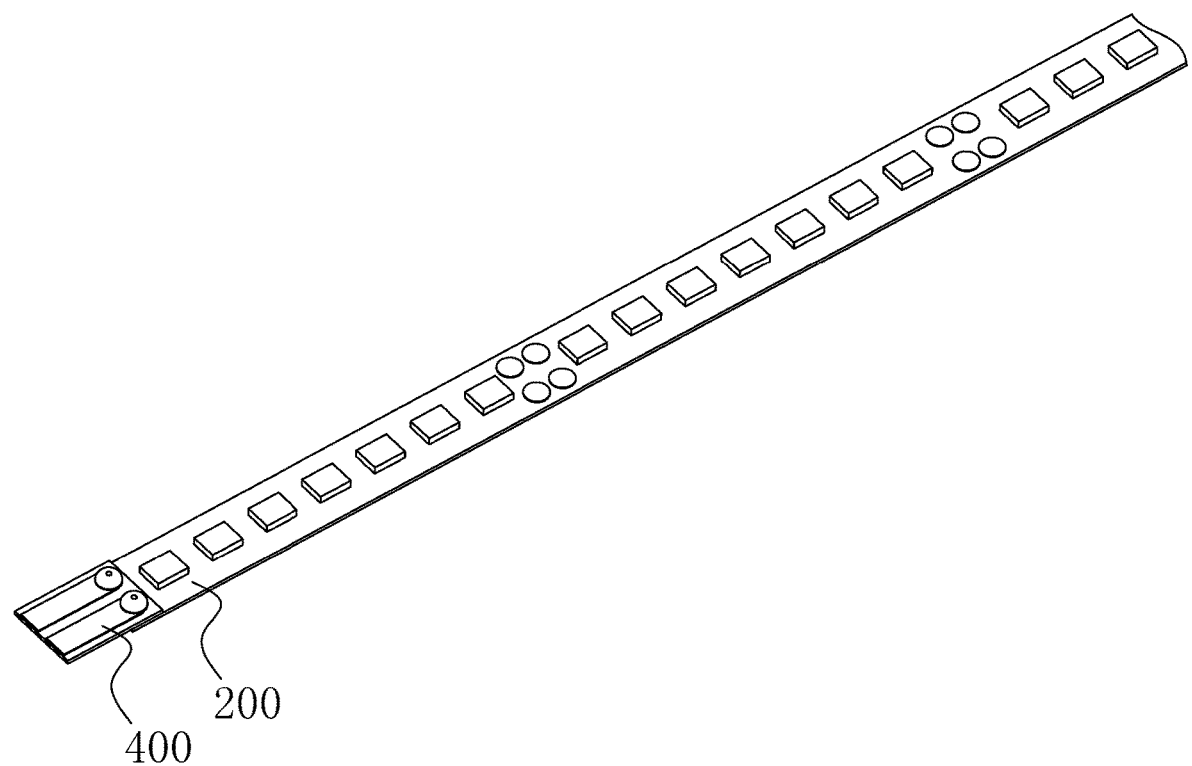
FIG. 3 is a schematic diagram of the structure of the LED flexible strip and the conductive flexible strip of the first embodiment after welding.
Figure 4:
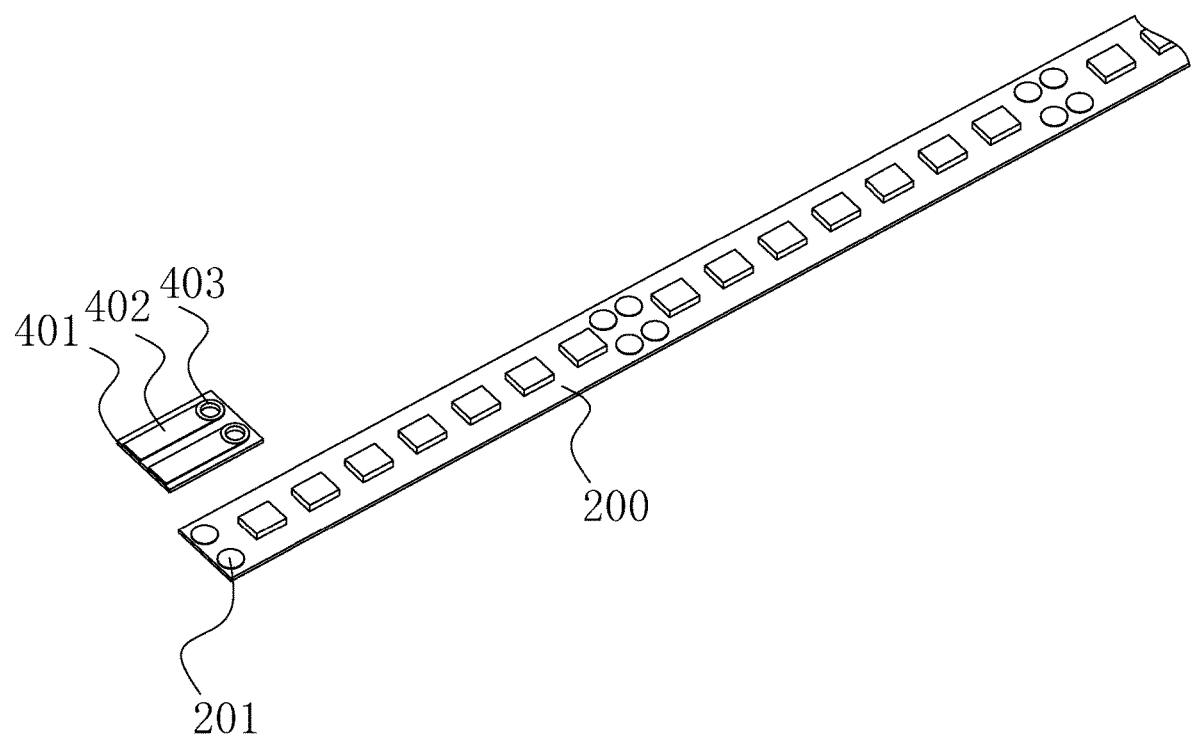
FIG. 4 is a schematic diagram of the structure of the LED flexible strip and the conductive flexible strip of the first embodiment before welding.
Figure 5:
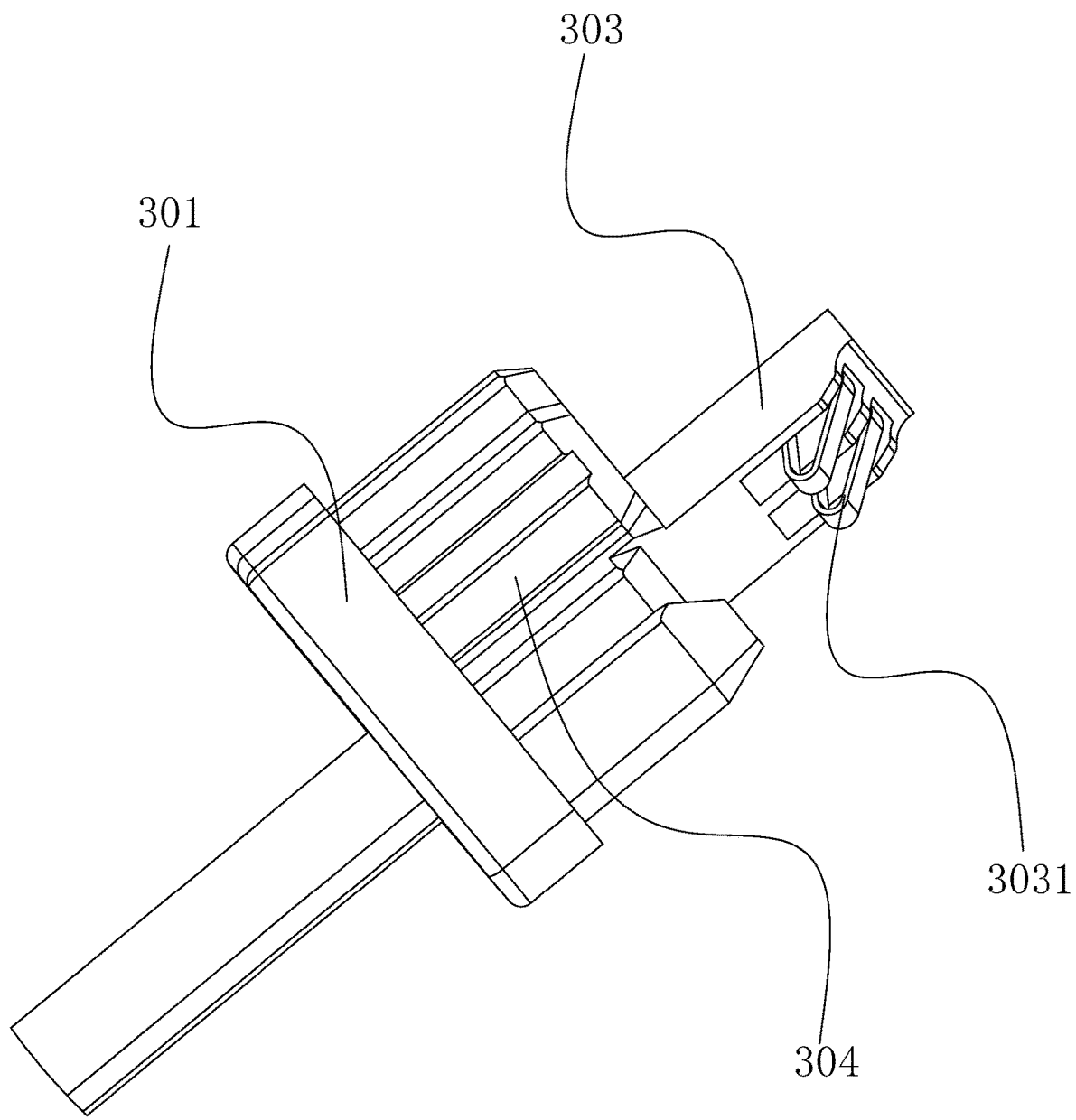
FIG. 5 is a schematic diagram of the structure of the lamp cap of the first embodiment.
Figure 6:
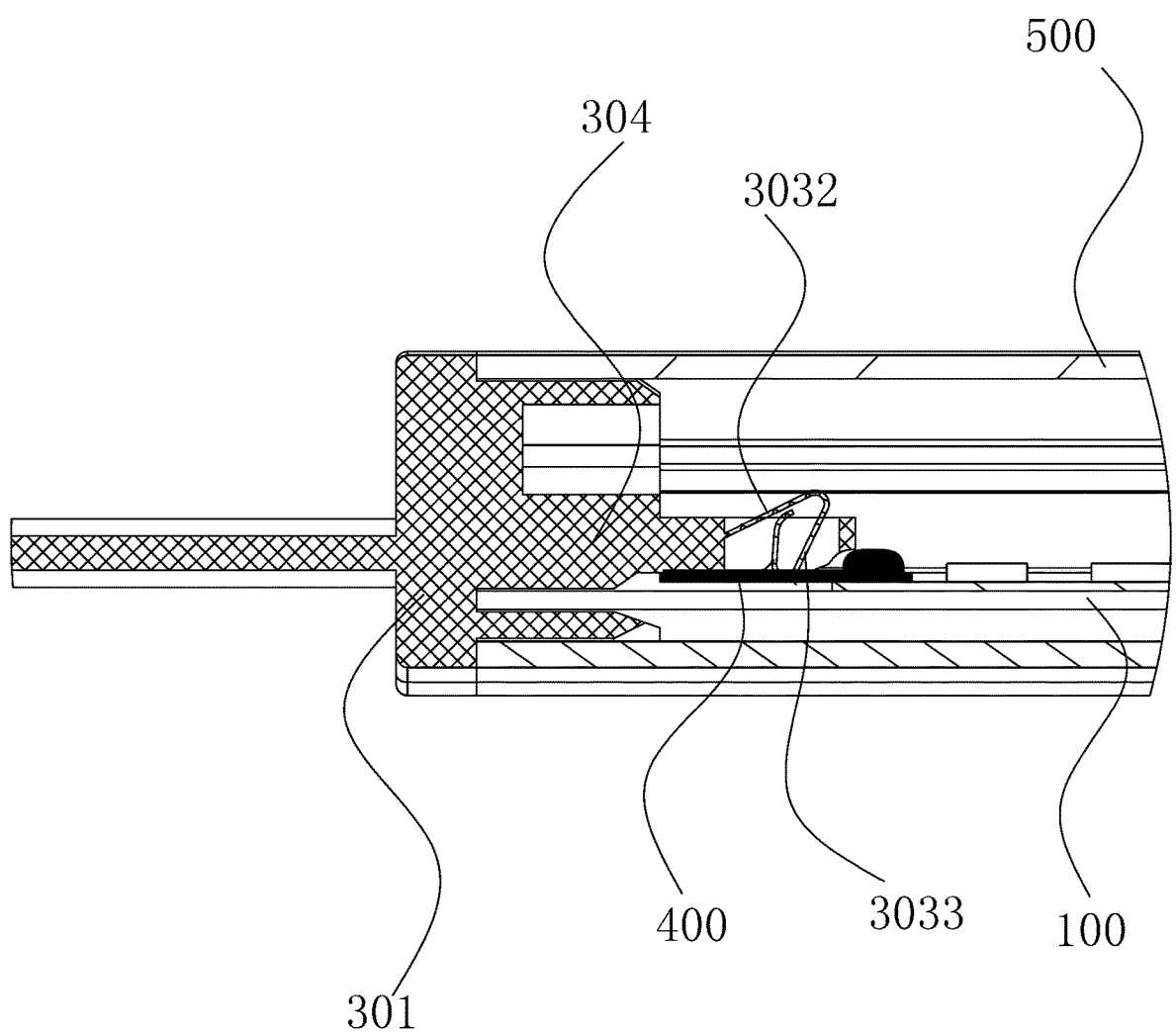
FIG. 6 is a schematic cross-sectional view of the connection between the lamp cap and the conductive flexible strip of the first embodiment.
Figure 7:
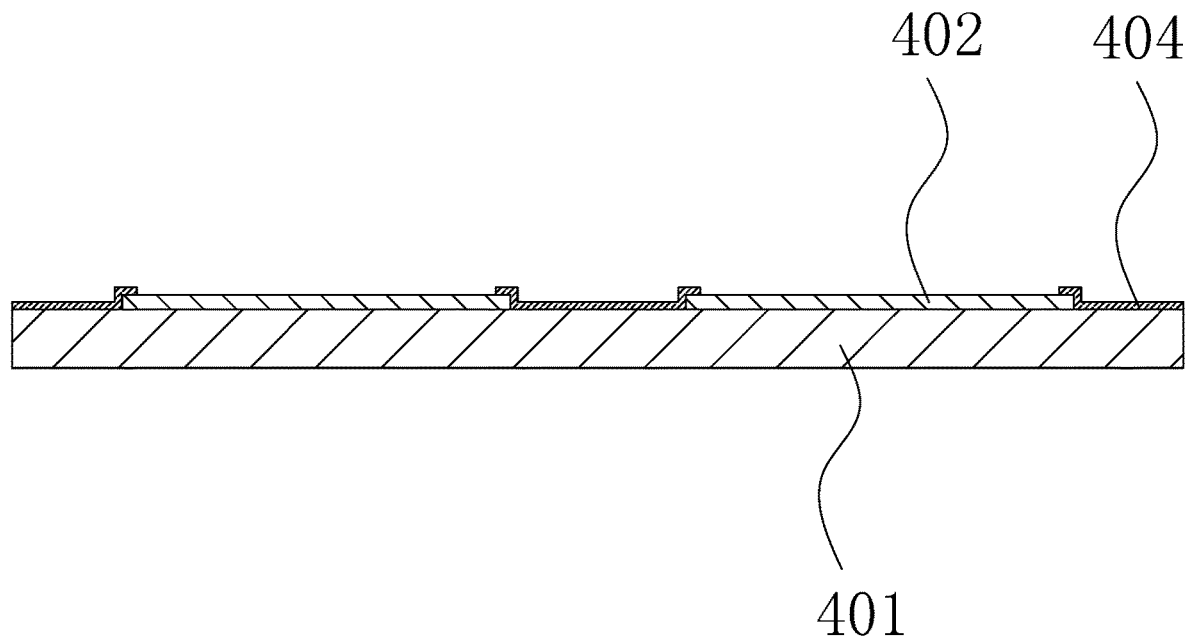
FIG. 7 is a schematic cross-sectional view of the conductive flexible strip of the first embodiment.

Specific embodiments of the present invention will be described in further detail below based on the drawings. It should be understood that the description of the embodiments of the present invention herein is not intended to limit the protection scope of the present invention.

As shown in FIGS. 1~7, the LED flexible strip lamp of this embodiment includes a strip lamp holder 100, an LED flexible strip 200 arranged on the strip lamp holder 100 and extending along its length, and a lamp cap 300 arranged on the end of the strip lamp holder 100. The LED flexible strip 200 includes a first bonding pad 201 disposed at its end, the LED flexible strip 200 is connected to a conductive flexible strip 400. The conductive flexible strip 400 includes a flexible insulating sheet 401, conductive metal foil 402, second bonding pad 403 and cover layer 404. The conductive flexible strip 400 is the same as the LED flexible strip 200, and uses a flexible printed circuit (FPC), which is known as a flexible printed circuit board or a flexible circuit board and has the excellent characteristics of light weight, thin thickness, free bending and folding, etc.

The flexible insulating sheet 401 is disposed on the strip lamp holder 100, and the flexible insulating sheet 401 uses polyester film or polyimide as the base of the conductive flexible strip 400.

The conductive metal foil 402 is arranged on the flexible insulating sheet 401 and extends away from the direction of the LED flexible strip 200. The conductive metal foil 402 generally uses copper foil, which has good conductivity and rust resistance. The copper foil is suitable for use in flexible circuits, in this method, electrodeposited (Electrodeposited for short: ED) or plating is used. One side of the electrodeposited copper foil has a glossy surface, while the processed surface on the other side is dull and dull. It is a flexible material that can be made into in varies thicknesses and widths. The matte side of copper foil by electrodeposited is often specially treated to improve its bonding ability. In addition to being flexible, forged copper foil is also hard and smooth. It is suitable for applications requiring dynamic deflection. The second bonding pad 403 is disposed on the flexible insulating sheet 401 and is located on the side of the conductive metal foil 402 close to the LED flexible strip 200 and electrically connected to the conductive metal foil 402. The second bonding pad 403 and the first bonding pad 201 is connected by welding. The cover layer 404 covers the top surface and avoids the working area of the conductive metal foil 402 and the second bonding pad 403, and plays a role of protection and fixation. Cover layer 404 is only drawn in FIG. 7.

In this embodiment, the lamp cap 300 includes an end cover 301, an external connector 302, and an internal connector 303. The end cover 301 is connected to the end of the strip lamp holder 100; the external connector 302 is arranged on the outer side of the end cover 301; the internal connector 303 is arranged on the inner side of the end cover 301, and the internal connector 303 includes an elastic conductive member 3031 abutting against the conductive metal foil 402.

The above-mentioned conductive flexible strip 400 has good flexibility and is connected to the LED flexible strip 200 by welding. since both have good flexibility, the welding point will not be weak when one of them is stressed, so the welding part is not easily broken when it is connected to the lamp cap 300 and the elastic conductive member 3031 exerts a force on the conductive metal foil 402, wherein it overcomes the technical prejudice that the LED flexible tape is not suitable for plug-in fitting.

The number of the first bonding pads 201 is determined by the number of external terminals of the LED flexible tape, generally 2 (positive and negative), 3, or 4, or more. There are at least two first bonding pads 201, which are spaced apart along the width direction of the conductive flexible strip 400. The conductive metal foil 402 and the second bonding pad 403 are provided with the same number of groups as the first bonding pad 201 and spaced apart along the width direction. The second bonding pad 403 and the first bonding pad 201 are respectively connected by welding in one-to-one correspondence, and the elastic conductive member 3031 is provided with the same amount as the conductive metal foil 402 and is distributed at intervals in the width direction, the elastic conductive member 3031 and the conductive metal foil 402 respectively abut in a one-to-one correspondence. In this embodiment, there are two first bonding pads 201 along the width direction.

The elastic conductive member 3031 has many forms and structures. It can be a spring sheet, a spring pin or a marble ball, etc. In this embodiment, for ease of manufacture, the elastic conductive member 3031 is a strip-shaped conductive strip which includes a connecting section 3032 and an abutting section 3033. One end of the connecting section 3032 is fixed, and the other end first extends along the length direction of the strip lamp holder 100; one end of the abutting section 3033 is connected to the connecting section 3032, and the other end is inclined and extended backward and turned upward.

In order to reduce the magnitude of the force between the elastic conductive member 3031 and the conductive metal foil 402, the connecting section 3032 is dangling in the direction perpendicular to the flexible insulating sheet 401, so the connecting section 3032 can also be deformed to reduce the squeeze from the connecting section 3033 to the conductive metal foil 402 to reduce friction and prevent the conductive metal foil 402 from moving or deforming.

The lamp cap 300 and the strip lamp holder 100 can be inserted and installed perpendicular to the length direction of the strip lamp holder 100, or along the length direction of the strip lamp holder 100. In this embodiment, the strip lamp holder 100 is provided with a lamp cavity 101 extending along its length direction. One side of the lamp cavity 101 is provided with a light outlet. In this embodiment, in order to prevent dust and uniform light, the light outlet is provided with a lamp shade 500. The end cover 301 includes an insert block 304 inserting from the end surface of the strip lamp holder 100 into the lamp cavity 101 along the length direction, and the elastic conductive member 3031 is disposed on the side of the insert block 304 facing the lamp cavity 101. During installation, the abutting section 3033 is installed in place against the conductive metal foil 402, where friction will be generated between the two, so the abutting section 3033 needs to be extended obliquely and folded upward.

In this embodiment, the first bonding pad 201 is a solder tab, and the second bonding pad 403 is a solder hole. The second bonding pad 403 is located above the first bonding pad 201 to achieve overlap welding. The conductive metal foil 402 is a long strip, which extends along the length direction of the strip lamp holder 100. The length of the conductive metal foil 402 is 10 mm to 30 mm.

Such as shown in FIG. 9, the manufacturing method of the LED flexible strip lamp of this embodiment adopts the above-mentioned LED flexible strip lamp and includes the following steps:

001. Connect the LED flexible strip 200 and the conductive flexible strip 400 by overlapping the second bonding pad 403 and the first bonding pad 201;

002. Mount the LED flexible strip 200 and the conductive flexible strip 400 on the mounting surface of the strip lamp holder 100; the mounting method can be double-sided tape, glue, or direct pressing and fixing. In this embodiment, double-sided tape is used to paste and fix.

003. Mount the lamp cap 300 to the end of the strip lamp holder 100 where the conductive flexible strip 400 is provided. The elastic conductive member 3031 of the lamp cap 300 abuts the conductive metal foil 402. The mounting of the lamp cap 300 to the strip lamp holder 100 is realized by plugging, and the plugging direction is along the length direction of the strip lamp holder 100.

Figure 8:
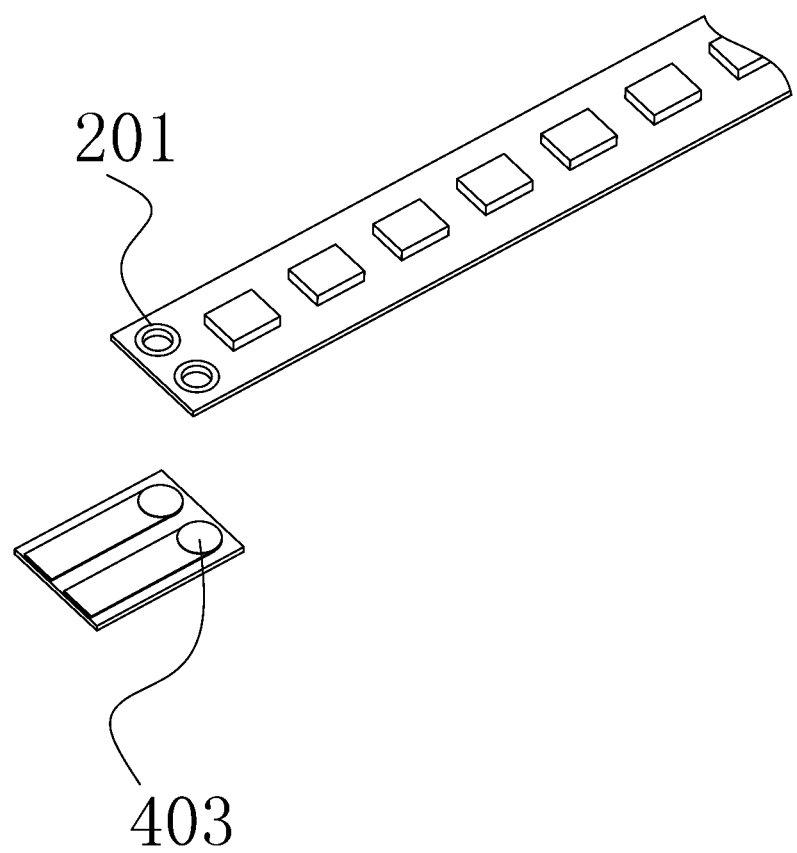
FIG. 8 is a schematic diagram of the structure of the LED flexible strip and the conductive flexible strip of the second embodiment before welding.

Such as shown in FIG. 8, in another embodiment, the rest is the same as the embodiment 1, but the first bonding pad 201 is a solder hole, and the second bonding pad 403 is a solder tab. The second bonding pad 403 is located below the first bonding pad 201 to realize overlap welding.

The above are only preferred embodiments of the present invention, and are not used to limit the protection scope of the present invention. Any modification, equivalent replacement or improvement within the spirit of the present invention is covered by the scope of the claims of the present invention.

What is claimed is:

1. An LED flexible strip lamp, comprising a strip lamp holder (100), an LED flexible strip (200) arranged on the strip lamp holder (100) and extending along its length, and a lamp cap (300) arranged on one end of the strip lamp holder (100), the LED flexible strip (200) includes a first bonding pad (201) disposed at its end, characterized in that, it also includes a conductive flexible strip (400) connected to the LED flexible strip (200), the conductive flexible strip (400) includes:
   a flexible insulating sheet (401), arranged on the strip lamp holder (100);
   a conductive metal foil (402), arranged on the flexible insulating sheet (401) and extending from reverse direction of the LED flexible strip (200);
   a second bonding pad (403), arranged on the flexible insulating sheet (401) and located on the side of the conductive metal foil (402) close to the LED flexible strip (200) and electrically connected to the conductive metal foil (402), the second bonding pad (403) and the first bonding pad (201) are connected by welding;
   a cover layer (404), which covers the top surface and avoids the working area of the conductive metal foil (402) and the second bonding pad (403);
   the lamp cap (300) includes:
   an end cover (301), connected to the end of the strip lamp holder (100);
   an external connector (302), arranged on the outer side of the end cover (301);
   an internal connector (303), arranged on the inner side of the end cover (301), and the internal connector (303) includes an elastic conductive member (3031) abutting against the conductive metal foil (402) and;
   the elastic conductive member (3031) is a strip-shaped conductive strip, which comprises a connecting section (3032) and an abutting section (3033); one end of the connecting section (3032) is fixed, and the other end first extends along the length direction of the strip lamp holder (100); one end of the abutting section (3033) is connected with the connecting section (3032), and the other end is inclined and extended backward and turned upward.

2. The LED flexible strip lamp as claimed in claim 1, wherein there are at least two first bonding pads (201), which are spaced apart along the width direction of the conductive flexible strip (400), so the conductive metal foil (402) and the second bonding pads (403) are provided with the same number of groups as the first bonding pads (201) and are spaced apart along the width direction; the second bonding pads (403) and the first bonding pads (201) are respectively connected by welding in one-to-one correspondence, and the elastic conductive members (3031) are provided with the same amount as the conductive metal foils (402) and distributed along the width direction at intervals, and the elastic conductive members (3031) and the conductive metal foils (402) respectively abut in a one-to-one correspondence.

3. The LED flexible strip lamp as claimed in claim 1, wherein the connecting section (3032) is dangling in a direction perpendicular to the flexible insulating sheet (401).

4. The LED flexible strip lamp as claimed in claim 1, wherein the strip lamp holder (100) is provided with a lamp cavity (101) extending along its length direction, a light outlet is provided on one side of the lamp cavity (101), and the end cover (301) includes an insert block (304) inserting from the end surface of the strip lamp holder (100) into the lamp cavity (101) along the length direction, and the elastic conductive member (3031) is arranged on the side of the insert block (304) facing the lamp cavity (101).

5. The LED flexible strip lamp as claimed in claim 1, wherein the first bonding pad (201) is a solder tab or a solder hole.

6. The LED flexible strip lamp as claimed in claim 1, wherein the second bonding pad (403) is a solder tab or a solder hole.

7. The LED flexible strip lamp as claimed in claim 1, wherein the conductive metal foil (402) is copper foil.

8. The LED flexible strip lamp as claimed in claim 1, wherein the conductive metal foil (402) is a long strip with its length along the length direction of the strip lamp holder (100).

9. The LED flexible strip lamp as claimed in claim 8, wherein the length of the conductive metal foil (402) is 10 mm-30 mm.

10. A method for manufacturing an LED flexible strip lamp, using the LED flexible strip lamp as claimed in claim 1, comprising the following steps:

step 001: connect the LED flexible strip (200) and the conductive flexible strip (400) by overlapping the second bonding pad (403) and the first bonding pad (201);

step 002: mount the LED flexible strip (200) and conductive flexible strip (400) on the mounting surface of the strip lamp holder (100);

step 003: mount the lamp cap (300) to one end of the strip lamp holder (100) provided with a conductive flexible strip (400), and after assembly in place, the elastic conductive member (3031) of the lamp cap (300) abuts the conductive metal foil (402).

11. The method for manufacturing the LED flexible strip lamp as claimed in claim 10, wherein the mounting of the lamp cap (300) to the strip lamp holder (100) is realized by plugging, and the plugging direction is along the length direction of the strip lamp holder (100).

* * * * *